(12) United States Patent
Logothetis

(10) Patent No.: US 7,042,307 B2
(45) Date of Patent: May 9, 2006

(54) COUPLER RESOURCE MODULE

(75) Inventor: James J. Logothetis, East Stroudsburg, PA (US)

(73) Assignee: Merrimac Industries, Inc., West Caldwell, NJ (US)

( * ) Notice: Subject to any disclaimer, the term of this patent is extended or adjusted under 35 U.S.C. 154(b) by 85 days.

(21) Appl. No.: 10/659,542

(22) Filed: Sep. 10, 2003

(65) Prior Publication Data

US 2005/0051359 A1   Mar. 10, 2005

(51) Int. Cl.
*H01P 3/08*   (2006.01)
*H03H 5/00*   (2006.01)

(52) U.S. Cl. .......................... 333/26; 333/33

(58) Field of Classification Search ................ 333/116, 333/117, 124, 125, 32, 33, 26

See application file for complete search history.

(56) References Cited

U.S. PATENT DOCUMENTS

| 6,099,677 | A | 8/2000 | Logothetis et al. | ......... 156/253 |
| 6,320,509 | B1* | 11/2001 | Brady et al. | ............. 340/572.7 |
| 6,395,374 | B1 | 5/2002 | McAndrew et al. | ........ 428/138 |
| 6,707,348 | B1* | 3/2004 | Ammar | ....................... 333/26 |

* cited by examiner

*Primary Examiner*—Dean Takaoka
(74) *Attorney, Agent, or Firm*—Clifford Chance US LLP

(57) ABSTRACT

A coupling assembly includes multiple composite substrate layers and a flange layer fusion bonded together in a stacked arrangement. The substrate layers are positioned on top of the flange layer and include embedded signal processing circuitry connected to a signal input and a signal output. A cavity is formed through an area of the substrate layers to expose signal connection terminals. These signal connection terminals are coupled to the embedded signal processing circuitry and they enable the addition of a circuit element to the assembly after the fusion bonding of the flange and substrate layers, and they enable the coupling of that added element to the signal processing circuitry.

20 Claims, 15 Drawing Sheets

1600

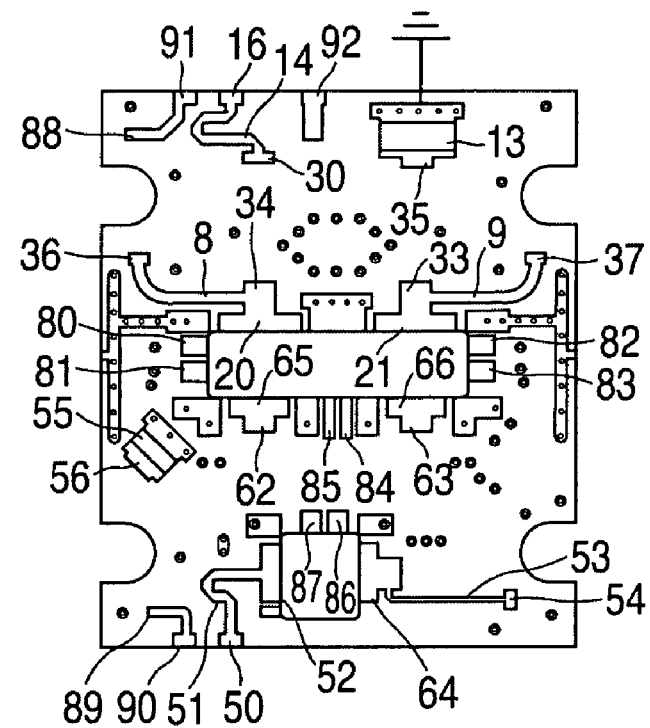
FIG. 18
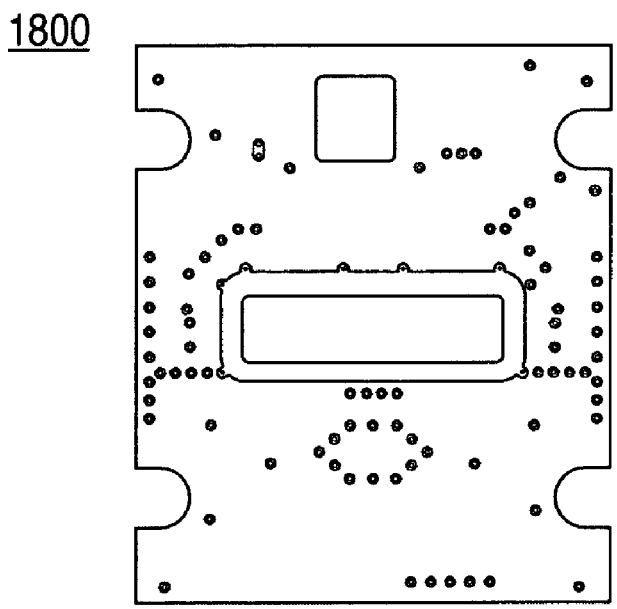
1800

COUPLER RESOURCE MODULE

BACKGROUND OF THE INVENTION

The development of planar transmission media in the early 1950's had a major impact on microwave circuit and component packaging technology. The engineering of the microwave printed circuit and the supporting analytical theories for stripline and microstrip occurred at a rapid pace. The early years of stripline circuit design were devoted almost entirely to the design of passive circuits such as directional couplers, power dividers, filters, and antenna feed networks. Early implementations were housed in bulky metal housings and connected by coaxial connectors.

To reduce size and weight, case-less and connector-less couplers were developed. These later implementations were sometimes referred to as "filmbrids" and included laminated stripline assemblies bonded together by fusion, or with thermoplastic or thermoset films. Further refinements continued in areas such as the dielectric materials used in these devices and the microwave-circuit fabrication process itself. A historical perspective on the development and applications of microwave integrated circuits, can be found in "Microwave Integrated Circuits—An Historical Perspective", H. Howe, Jr., IEEE Trans. MTT-S, Vol. MTT-32, pp.991–996; September 1984; and "Microwave Printed Circuits—The Early Years", R. M. Barrett, IEEE Trans. MTT-S, Vol. MTT-32, pp. 983–990; September 1984.

Stripline and microstrip components have been integrated for various applications in housings and packages, as well as monolithically on a common substrate. Methods of integration and packaging affect the system interface and installation, as well as the module's ability to handle post-processing temperatures (i.e., post-manufacture of the stripline or microstrip component), and the module's operating thermal management ability (i.e., its heat transfer ability). Common techniques for integrating components call for bonding them together using, e.g., epoxies, adhesives and solder. In some cases, a module that uses epoxies, adhesives, solder and/or other bonding agents will be subject to subsequent processing steps exposing the module to high temperatures or other processing conditions. These subsequent processing steps must be compatible with the bonding agent and material used in forming the modules. For example, when a module is formed using conventional epoxies, adhesives, and solders, high temperature post-processing may need to be avoided as it may cause deterioration in module bonding.

Microwave couplers that can be subject to, and retain their integrity under, a wider range of manufacturing processes are desired. Accordingly, there exists a need to integrate microwave coupler circuitry, DC blocking structures, impedance matching networks, bias decoupling structures and RF load terminations into a structure that will be able to withstand, high temperature processing or other processing steps that the module may be subject to after its manufacture. Such high temperature processing may occur, e.g., when the microwave module is integrated with other components in a circuit assembly. In addition, there exists a need to integrate microwave coupler circuitry, DC blocking structures, impedance matching networks, bias decoupling structures, and RF load terminations that will afford optimal thermal conductivity. Furthermore, there exist a need to have coupling circuitry that can be easily customized by the addition of components post-manufacture of the coupling assembly.

SUMMARY OF THE INVENTION

A coupling module that can be used, e.g., for the integration of microwave couplers, DC blocking structures, impedance matching networks, bias decoupling structures and RF load terminations is disclosed. The module, also referred to herein as a "resource module", has a multi-layer module architecture that can include multiple circuit layers fusion bonded to a metal flange. The metal flange can be used for device attachment and thermal management, and as a package interface and for installation. The resource module can include a device attachment area (also referred to as a "resource well" or a "cavity" through the substrate layers). The resource well allows the addition of devices to the module, and coupling of those devices to circuitry in the resource module, after the module itself has been formed. That is, additional devices can be added into the resource well after the layers of the resource module have been fusion bonded. In some implementations, the resource well includes attachment points within the well whereby an added device can be signal-connected to coupler circuitry formed in the resource module's dielectric layers, and can be coupled to the module's metal flange. A fusion bonded resource module with integrated flange may be used to provide a common platform for various microwave circuit applications, and a method of system interface and installation which offers a significant degree of freedom by allowing high temperature device attachment processing, as well as optimal operating thermal management. This common platform can be customized by adding a wide variety of circuits and circuit elements to the resource module. These circuit elements can include microwave circuits, transistors, varactor diodes, PIN diodes, and Shottky diodes.

In one implementation, the coupling assembly includes multiple composite substrate layers and a flange layer fusion bonded together in a stacked arrangement. The substrate layers are positioned on top of the flange layer and include embedded signal processing circuitry connected to a signal input and a signal output. A cavity is formed through an area of the substrate layers to expose signal connection terminals. These signal connection terminals are coupled to the embedded signal processing circuitry and they enable the addition of a circuit element to the assembly after the fusion bonding of the flange and substrate layers, and they enable the coupling of that added element to the signal processing circuitry.

Implementation may include one or more of the following features. The embedded signal processing circuitry (which may include, e.g., microwave coupler circuitry, impedance matching circuitry, DC blocking circuitry, bias decoupling circuitry, and/or RF load terminations) can include first signal processing circuitry coupled to the signal input and to a first signal connection terminal exposed within the cavity and second signal processing circuitry coupled to the signal output and to a second signal connection terminal exposed within the cavity. The cavity can be configured to receive added circuit element such as a microwave circuit, a transistor, a varactor diode, a PIN diode, a Shottky diode, or other circuit elements. There may also be conductive terminals exposed within the cavity and coupled to conductive terminals on an exterior surface of the assembly to provide for signal connections between a circuit element added to the cavity and external signal sources.

Implementations may also include one or more of the following features. The cavity may expose a top surface of the flange layer enabling coupling (e.g., either electrical or thermal coupling) of the added circuit element to the flange layer. The flange layer can be formed of a substantially homogeneous metal core. Plated metals (e.g., nickel, gold, or other metal inhibiting oxidation of the metal core) may be added to the surfaces of the flange layer. Interconnections can be made between substrate layers using plated via holes.

Manufacture of the coupling assembly includes drilling the substrate layers to create a plurality of vias and forming cutouts in the substrate layers. The cutouts are positioned such that when the substrate layers are fused in a stacked arrangement on top of the flange layer, the cutouts form a cavity through the substrate layers exposing a top surface of the flange layer. Prior to fusion bonding, the surfaces of the substrate layers are metalicized to form embedded signal processing circuitry elements, signal input and output terminals, signal connection terminal exposed within the cavity, and conductive vias interconnecting the foregoing structures when the plurality of composite substrate layers are positioned in a stacked arrangement. A cutout may be formed in the top-most substrate layer after the fusion bonding, while cutouts in other substrate layers may be formed prior to fusion bonding.

The details of one or more implementations of the invention are set forth in the accompanying drawings and the description below. Other features, objects, and advantages of the invention will be apparent from the description and drawings, and from the claims.

DESCRIPTION OF THE DRAWINGS

FIGS. 16–18 show top and bottom metal layers of three dielectric substrates implementing the signal processing circuit of FIG. 14.

DETAILED DESCRIPTION OF THE INVENTION

Figure 1:
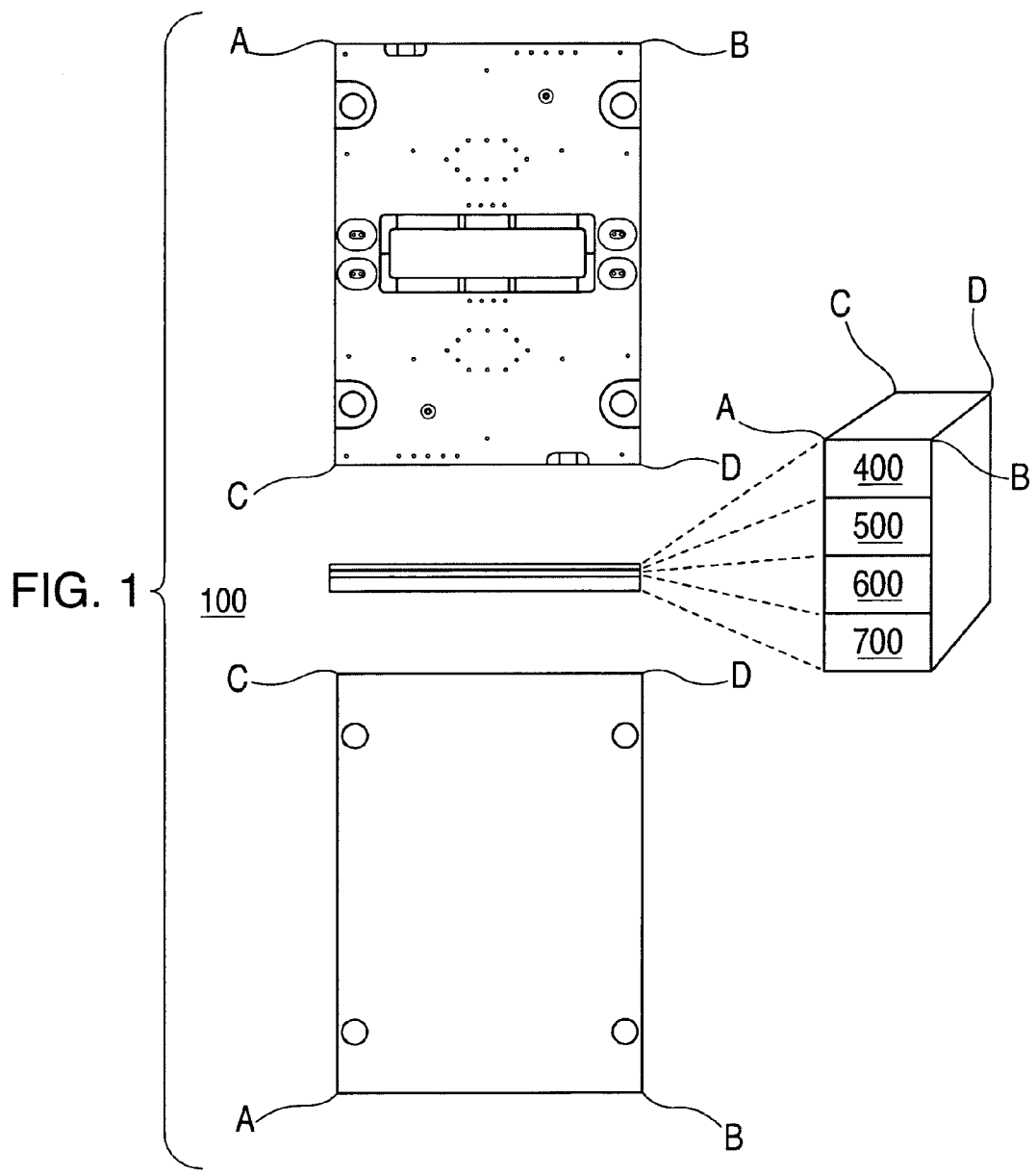
FIG. 1 show a top, side, and bottom view of an assembled resource module.

A "resource module" structure is disclosed herein. Top, side, and bottom views of the module are shown in FIG. 1. As shown in side view, and in more detail in FIGS. 4–7, the resource module 100 may be fashioned from a stack of bonded substrate layers and a metal flange layer. The substrate layers are preferably formed of polytetrafluoroethylene (PTFE), glass, and ceramic. Each substrate layer may include circuitry on one or both sides. The circuitry can include, e.g., microwave directional couplers, and 3 dB quadrature couplers, impedance matching networks, DC blocks, bias decoupling, and RF load terminations. The flange layer provides for mounting of the resource and for improved thermal properties.

Figure 2:
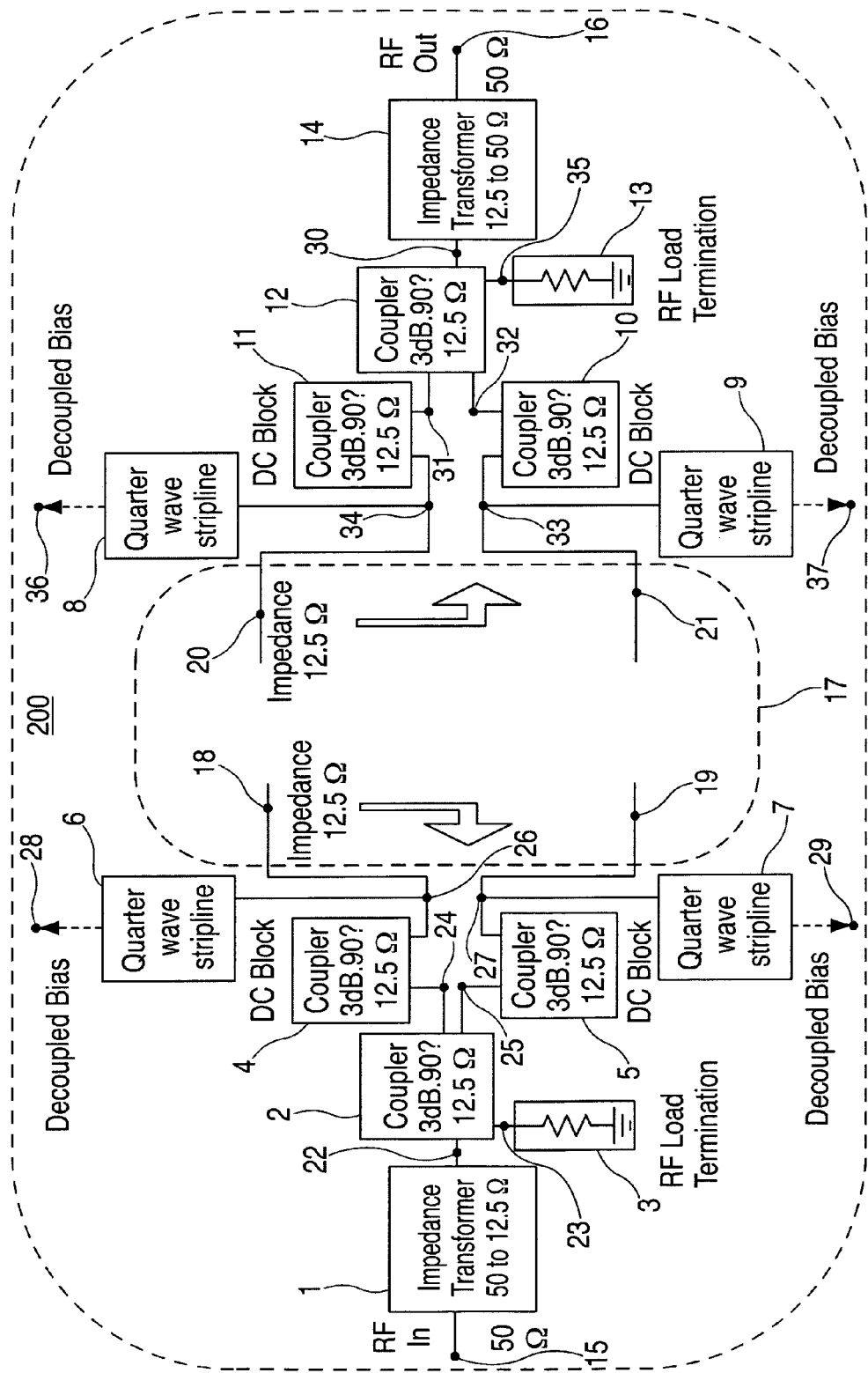
FIG. 2 is a block diagram showing signal processing circuit components that may be included in an implementation of the resource module of FIG. 1.
Figure 3:
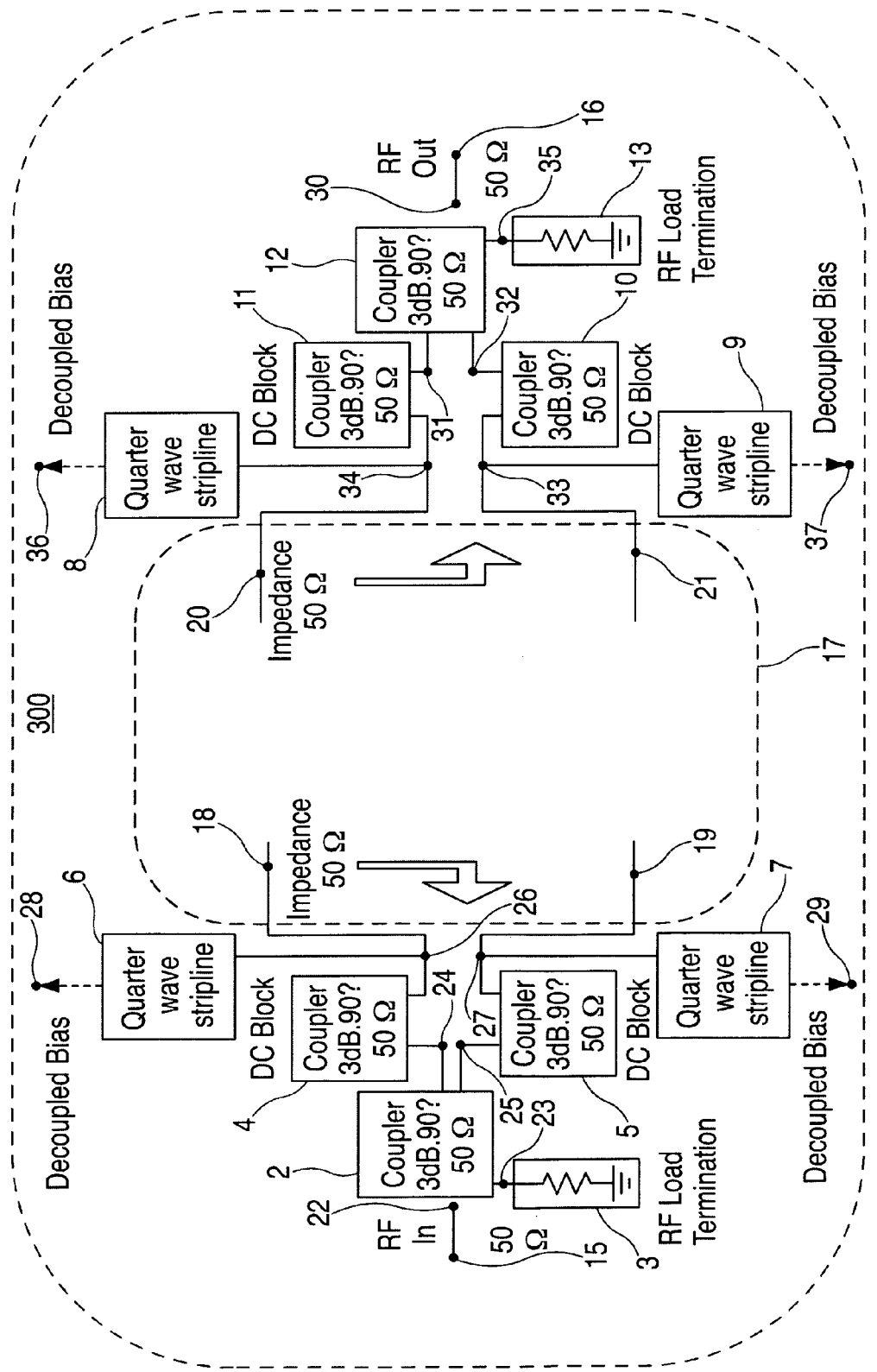
FIG. 3 is a block diagram showing signal processing circuit components that may be included in an alternative implementation of the resource module of FIG. 1.

FIGS. 2 and 3 are block diagram for different implementation of the resource module. The block diagram of FIG. 2 shows circuitry 200 that is formed in the substrate layers of FIGS. 4–6. An example of how this circuit operates will given for the case of 12.5 ohms, although similar operation occurs for circuits of other impedance values. The example shown is for the case of 3 dB couplers, however other networks can be composed using couplers with other coupling values. In figures used throughout this disclosure, like-numbered elements reference the same structure (whether in, e.g., the block diagram form of FIGS. 2 and 3 or in the flange and dielectric layer forms of FIGS. 4–7). The circuitry shown in the block diagram of FIG. 2 may be used where the impedance at input 15 and output 16 is different from the impedance of devices added to the resource well 17. In particular, the circuitry 200 is for an implementation in which inputs and outputs are at 50 ohms and the module enables attachment of 12.5 ohm devices in the resource well 17. The circuitry in the block diagram of FIG. 3 is for an implementation in which input, output, and attached resource impedances are the same. The circuit elements shown in FIG. 3 are substantially identical to those of FIG. 2 except that the block diagram of FIG. 3 lacks transformer elements 1, 14 of FIG. 2. Substrate layers to implement 300 follow from those for the circuit 200 of FIG. 2.

The circuit 200 receives a RF input signal at terminal 15. The input signal is transformed from 50 ohms to 12.5 ohms by transformer 1 and the output signal 22 is then divided by a first coupler 2. The resulting two signals at 24, 25 are then fed through individual couplers 4, 5, respectively. The couplers 4, 5 perform DC blocking functions. Two RF signals 26, 27 are now available at resource well terminals 18, 19, respectively. The signals at terminals 18, 19 can be connected to devices such as transistors, varactor diodes, PIN diodes, and Shottky diodes that may be added to the resource well 17 after formation of the module 100. Additional signal terminals may be present in the well 17 for, e.g., ground connections or connections to external signal sources. In addition, other lumped components such as resistors, capacitors and inductors may be placed in the resource well 17. After the RF signals are processed by the devices in the well 17, they are output to terminals 20, 21 and processed by circuitry 8–14. Circuits 8–14 perform a complementary function to that of circuitry 1–7. That is, signals on terminals 20–21 are provided at input points 33, 34 to couplers 10, 11 and to quarter wave striplines 8, 9. The couplers 10, 11 serve to block DC bias from input signals 33, 34. The coupler output signals 31, 32 are then recombined by an output coupler 14 and the output 30 from the coupler 12 is provided to impedance transformer 14 which transforms the input signal 30 from 12.5 ohms impedance to a 50 ohms output impedance at signal point 16.

The devices used in the resource module 17 may require a DC bias for operation. This DC bias is contained in the device area 17 by the DC blocks 4, 5, 10, 11. The DC bias 28–29, 36–37 is connected to the device area 17 through bias decoupling lines (i.e., quarter wave striplines 6-9) which appear as an open circuit to the RF signal in the device area 17. The RF load terminations 3, 13 are connected to the couplers 2 and 12 at signal points 23, 35, respectively, and provide matched impedance to isolated ports of the couplers. The impedance of the terminations 3, 13 matches the coupler impedance.

Figure 9:
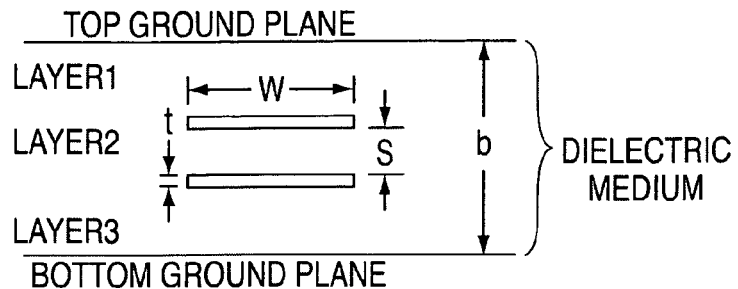
FIGS. 9–12 show different types of striplines.
Figure 10:
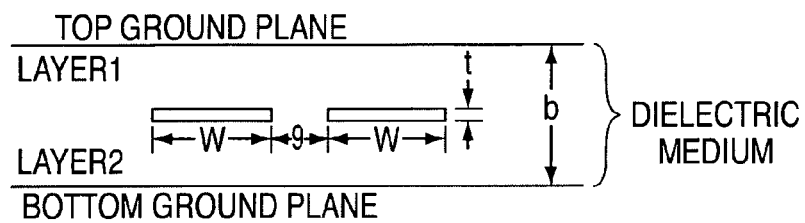
Figure 11:
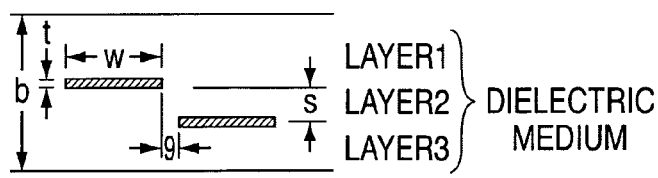
Figure 12:
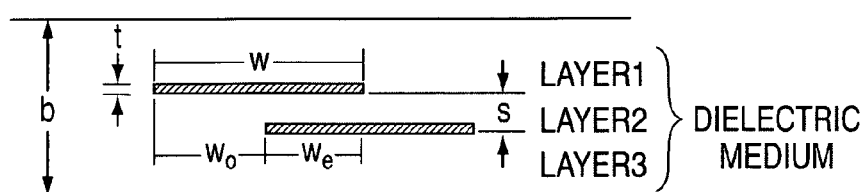

Basic principles for design of the design of the microwave directional couplers and 3 dB quadrature couplers circuitry is well known to those skilled in the art, and described in such papers as "Shielded Coupled-Strip Transmission Line", S. B. Cohn, IEEE Trans. MTT-S, Vol. MTT-3, No. 5, pp. 29–38; October, 1955; "Characteristic Impedances of Broadside-Coupled Strip Transmission Lines", S. B. Cohn, IRE Trans. MTT-S, Vol. MTT-8, No. 6, pp.633–637; November, 1960; and "Impedances of Offset Parallel-Coupled Strip Transmission Lines", J. P. Shelton, Jr., IEEE Trans. MTT-S, Vol. MTT-14, No. 1, pp. 7–15; January, 1966. Directional couplers are usually implemented as edge-coupled striplines (FIG. 10) or offset-coupled striplines (FIG. 11, 12), whereas quadrature couplers are typically configured as offset-coupled striplines (FIG. 12) or broadside-coupled striplines (FIG. 9). The teaching of this disclosure demonstrates that stripline couplers synthesized from these theories may be integrated in a resource module with integrated flange.

The resource module, including the circuitry of FIG. 2, may be implemented using three dielectric substrate layers bonded together with a thick metal flange. The substrate layers can be formed of modern composite dielectric materials (containing PTFE, glass and ceramic). These materials have electrical and mechanical properties that are stable over wide temperature ranges, and have low loss properties that enhance performance at microwave frequencies. Coefficient of thermal expansion values close to copper allow the formation of reliable plated-through holes and slots. These plated-through features are used to connect conducting layers into stacked stripline structures as well as to form separated groundplanes. Ground slots can be formed in mathematical proximity to signal holes through the dielectric layers to form slab transmission lines maintaining a controlled impedance for propagation in the Z direction (i.e., from top to bottom through the layers of the stacked dielectric layer structure).

Figure 4:
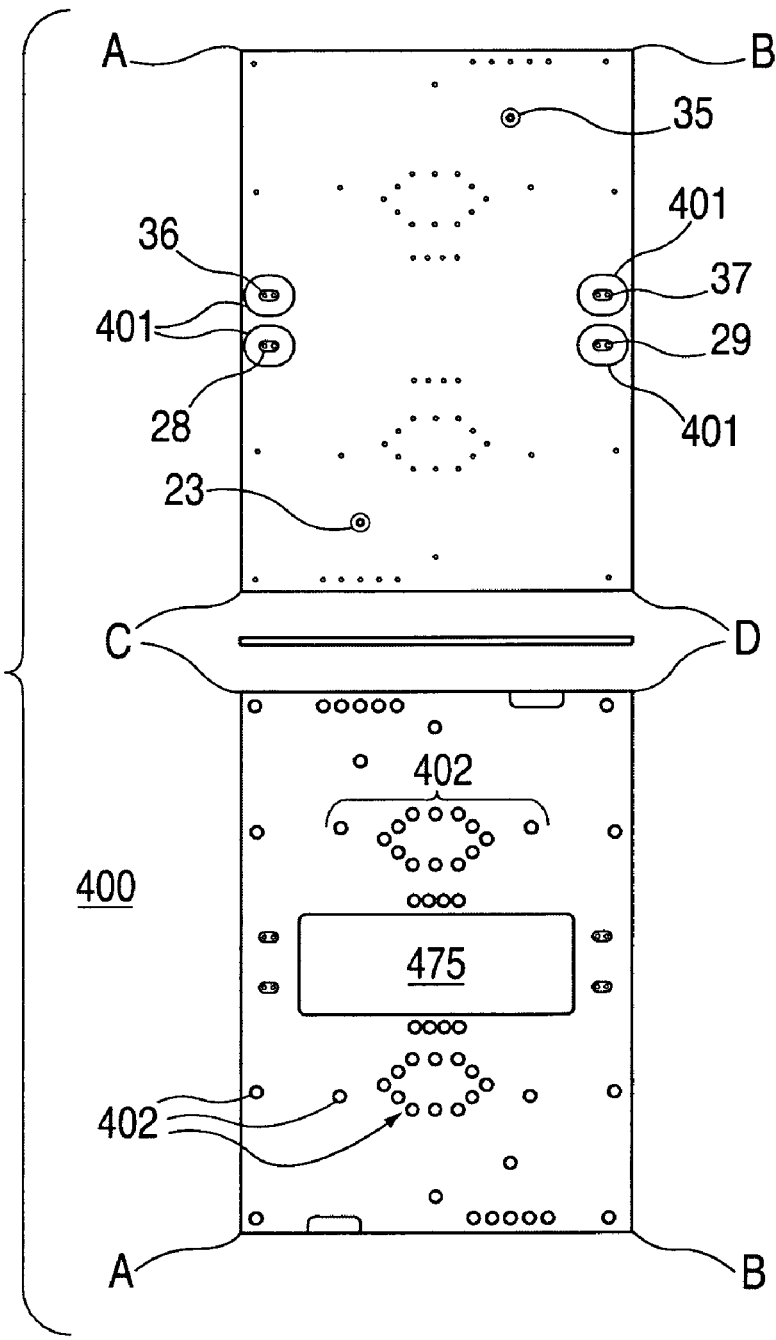
FIGS. 4–6 show top and bottom metal layers of three dielectric substrates implementing the signal processing circuit of FIG. 2
Figure 5:
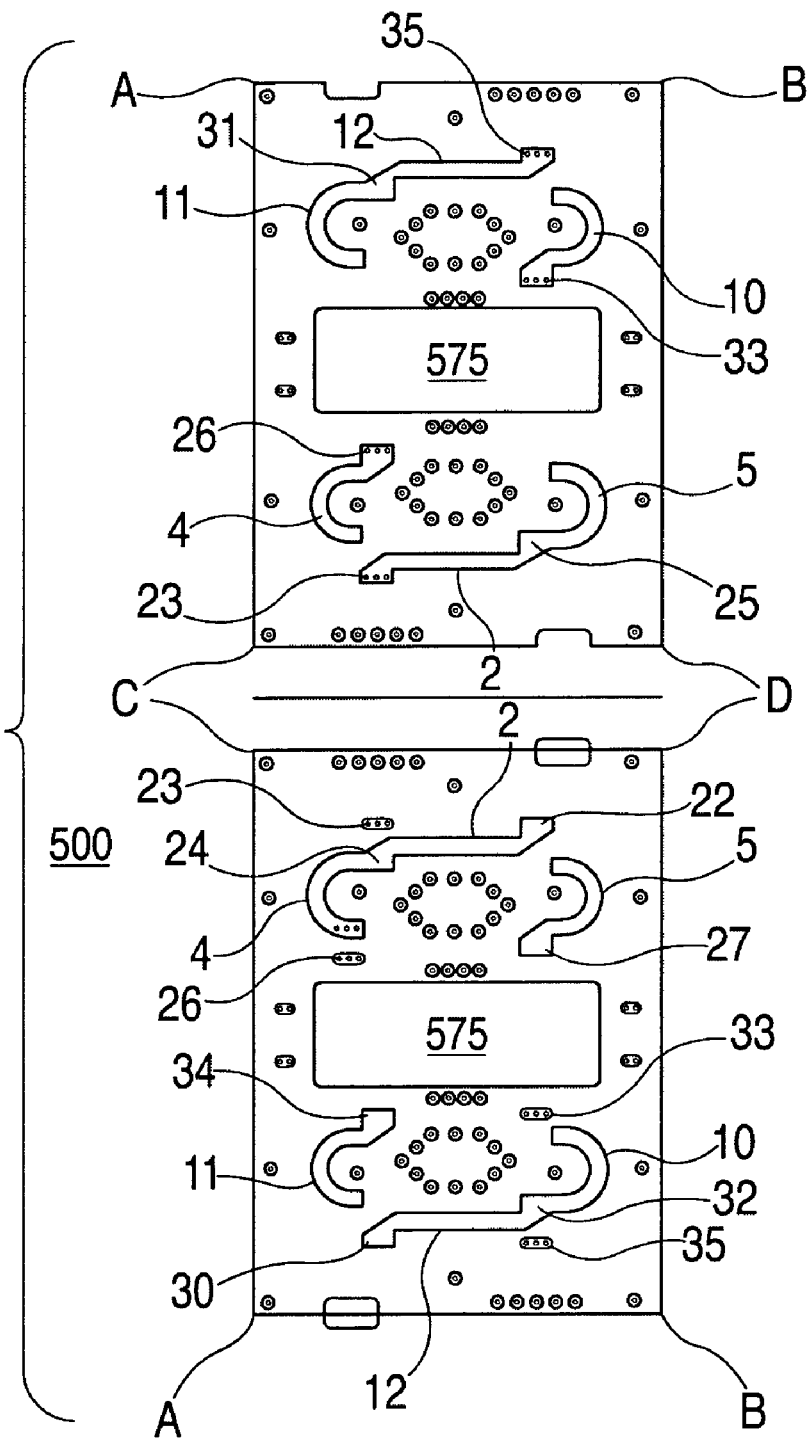
Figure 6:
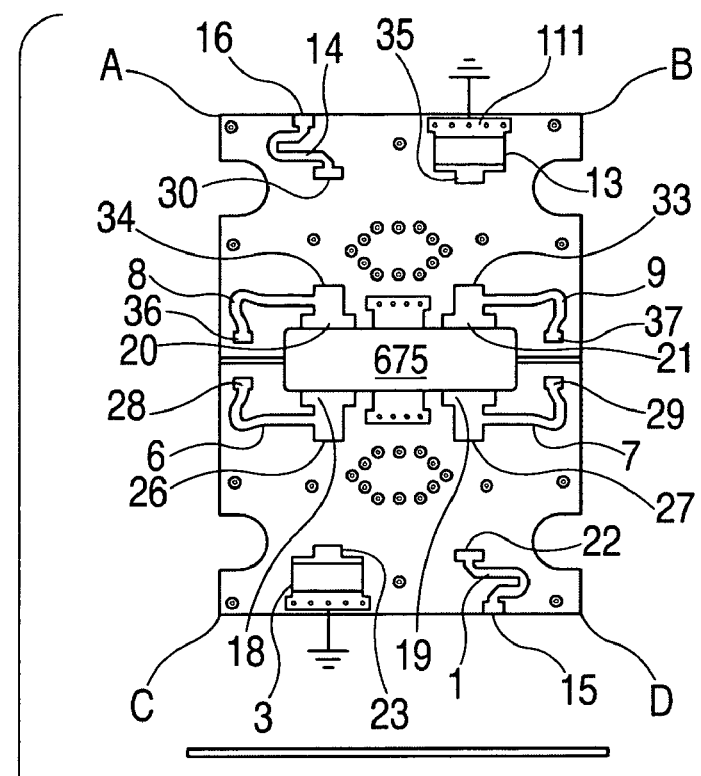
Figure 6:
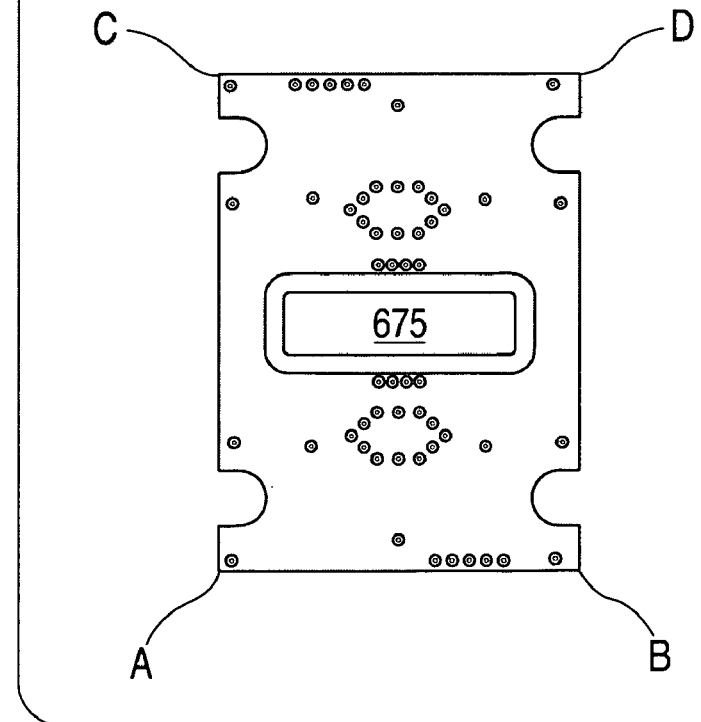
Figure 7:
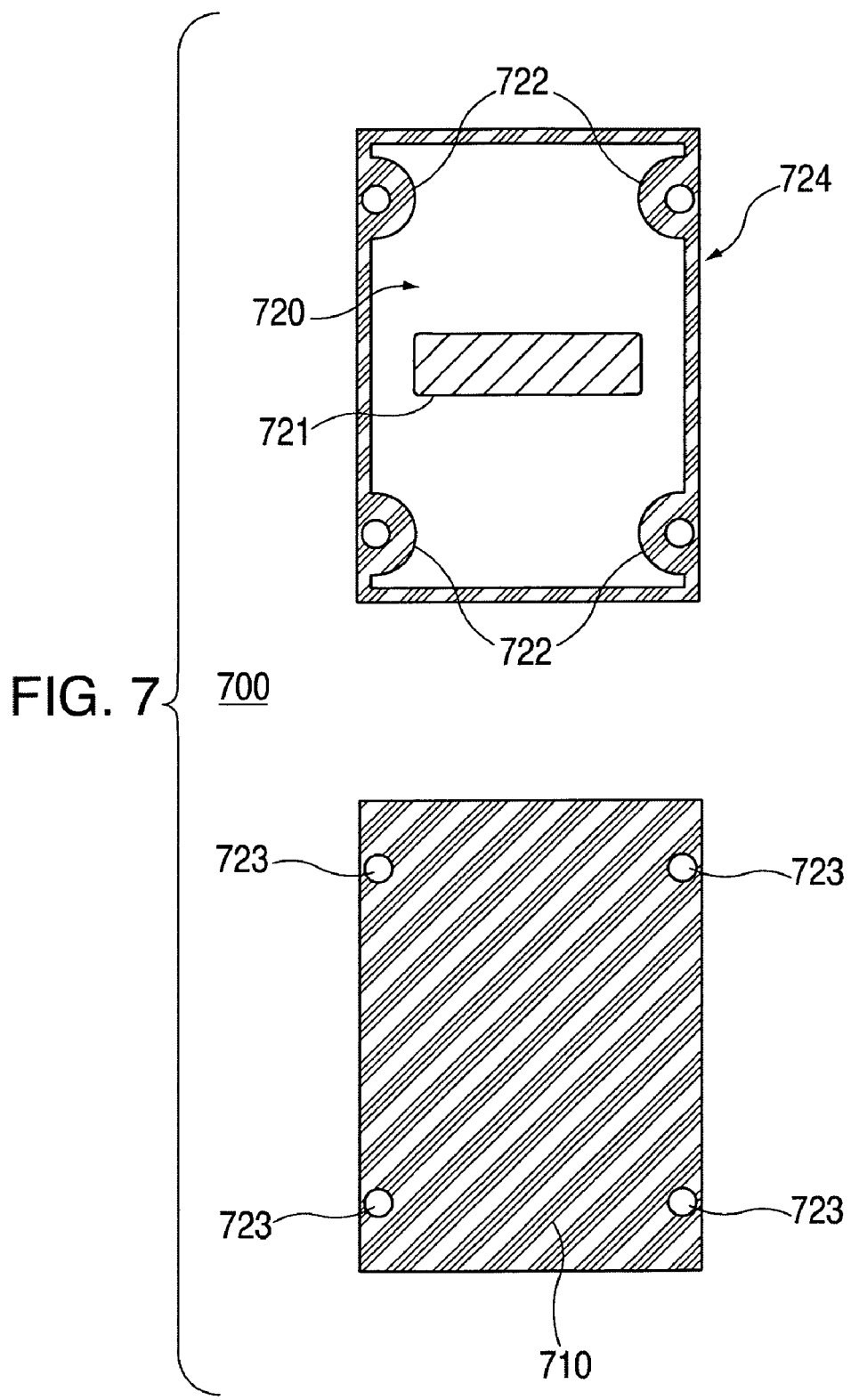
FIG. 7 shows top and bottom views of a metal flange layer.
Figure 8:
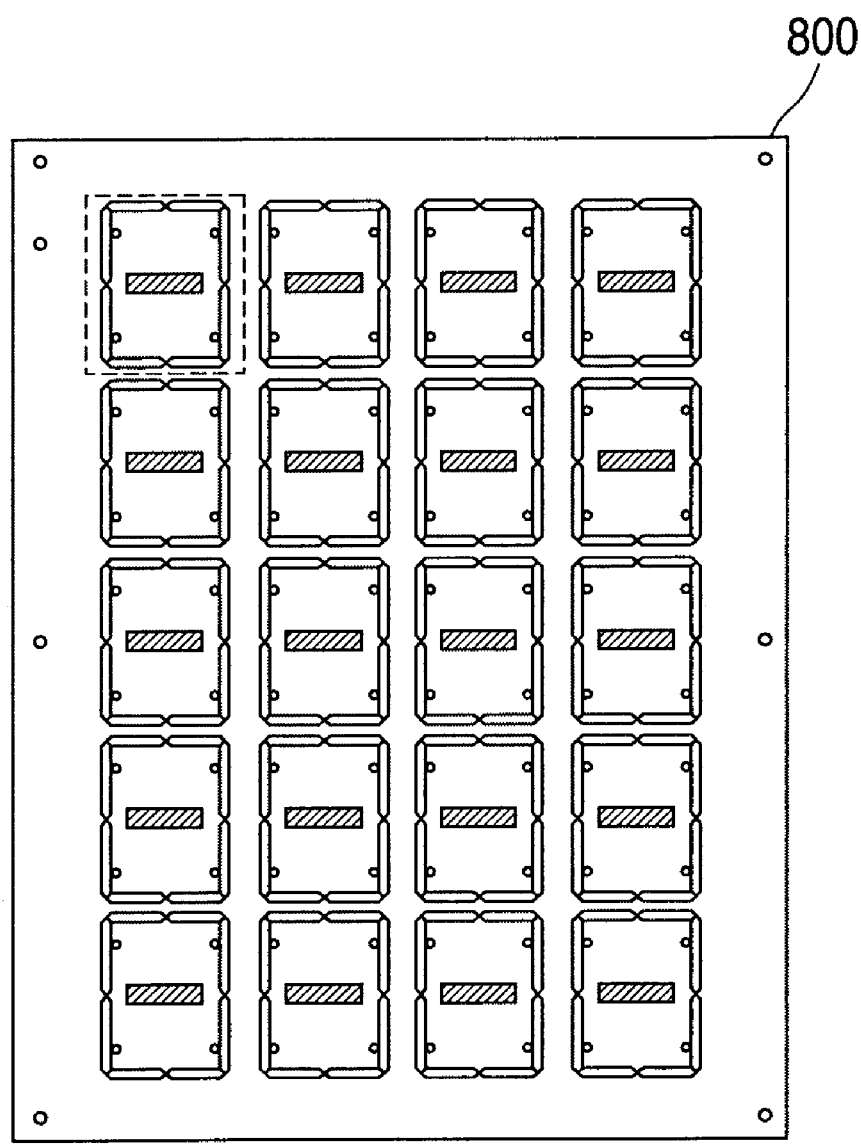
FIG. 8 shows a panel array.

FIGS. 4–6 show top, side, and bottom views for three substrate layers 400, 500, 600 forming the module 100. The top-side view can be matched to the bottom-side view by folding the page one the horizontal rectangle formed by the side view. The substrates 400, 500, 600 can be formed from composites of polytetrafluoroethylene, glass, and ceramic, having a range of relative dielectric constants (Er) from 2.1 to 20.0, and a range of thickness (h) from 0.001 to 0.060 inches. The substrates, are metalized with copper foil (typically 0.0007 inches thick, but may range from 0.0001 to 0.003 inches), and are etched to form circuits. Via holes and slots (i.e., elongated holes and openings), plated with copper, connect one substrate layer to another. Examples of slots include slots 401; examples of via holes include holes 402 (other slots and holes are shown in the drawings and are left unnumbered). Details of each layer of the assembly are shown in FIGS. 4 through 7. The modules are fabricated in array panels as shown in FIG. 8.

The resource modules described in this disclosure can be fabricated following the processes disclosed in U.S. Pat. No. 6,099,677 (the '677 patent) and U.S. Pat. No. 6,395,374 (the '374 patent), incorporated herein by reference. The layers 400, 500, 600 and a thick metal flange 700 (FIG. 7) are bonded together, directly, by a fusion process, which utilizes a specific profile of temperature and pressure to change the material's state, and form a homogeneous dielectric, while also permanently attaching the dielectric to the thick metal flange. Fusion bonding of a thick metal flange directly to the dielectric layers provides a mechanical mounting interface for system installation. The multilayer resource module may be bolted directly into a system assembly by means of mounting holes 701 in the flange. Since the fusion bonding process occurs at temperatures between 350° C. to 400° C., the resource module can easily withstand the elevated post process assembly temperatures used for device attachment within the resource well 17. These post-process assembly temperatures can include temperatures arising from attachment of devices using solders (Sn63, Sn96, Au/Si eutectic), epoxies (silver-filled epoxy, insulating epoxy), and adhesives (silver-filled glass, silver-filled cyanate ester).

Fusion bonding of a thick metal flange 700 directly to the dielectric layers (in particular, to the bottom layer 600) provides an integrated heat sink for thermal management of dissipated RF and DC power. Cutout areas 475, 575, 675 in layers 400, 500, 600 allow for device mounting directly to the flange or on a dielectric layer surface with thermal vias conducting heat to the flange. In some implementations, the cutout areas 475, 575, 675 may be progressively smaller (from top surface to bottom surface) to expose different attachment areas on different dielectric layers. Etched metal-film resistors and printed thick film resistors may be included in the circuit layers, while resistor components may also be attached in the resource well 17. All of these resistors, typically configured as RF load terminations, can benefit from attachment to the heat sink flange, enabling them to operate at higher power levels.

The following steps summarize construction of the resource module 100 in accordance with the process disclosed in the '677 patent and the '374 patent. It should be understood that each substrate 400–600 and flange 700 is manufactured as part of a panel (e.g., panel 800) that, in general, will include a number of identical substrate elements (though, in some cases, such as where only a few devices need to be manufactured, panels could be manufactured with a number of different substrates to form differently configured resource modules).

Construction of one implementation of the resource module will now be described. The flange plate layer and each of the substrate layers can be manufactured as follows.

Manufacture of the Flange Plate
1. Each flange plate 700 is formed by selectively plating a copper panel with nickel and gold.
2. Attachment holes 723, as well as slots and alignment pin holes, may then be drilled through the flange plate 700. The attachment holes 723 are included when, e.g., the completed module is to be screw-mounted to another surface.
3. The entire bottom surface 710 may be nickel/gold plated while the top surface 720 may be nickel/gold plated over the entire top surface or, in some implementations, nickel/gold plating may be limited to the area around the perimeter 724 of the surface 720 and in the area 722 surrounding attachment holes 723 and slots.
4. Selective gold plating may be used in the resource well area 721. The selective gold plating 721 provides for improved corrosion resistance in the area 721 and helps to ensure a good electrical connection between the flange plate 720 and devices added in the resource well 17. A photoresist process can be used to define the area for selective gold plating.

Manufacture of Substrate Layers
1. Drill slots and via holes through the substrates layers (400, 500, 600). Alternatively, slots and via holes through the substrate layers may be formed by drilling and then plasma etching of the exposed substrate layers within the hole and slots, before plating with copper.

2. The substrate layers (in particular, the hole and slots) are then plated with copper, first using an electroless copper seed layer, followed by an electrolytic copper plate, preferably to a thickness of 0.0005 to 0.0010 inches.
3. The substrate layers are then laminated with photoresist on both sides of each layer. The photoresist is exposed using photographic masks, and then developed to reveal selected areas of the substrate layers. After exposing and developing the photoresist, the photoresist remains to protect the copper layer used to form structures 1–14 and interconnections (e.g., 15–37). The plated copper is then etched from areas of the substrate layers that are not shielded by photoresist.
4. Resistors 3 and 13 are then formed by further etching the copper in the areas of the resistors 3, 13, exposing a thin film of nickel phosphate below the copper layer. To do so, photoresist is again applied to the substrate layers. Using a photographic mask, the photoresist is exposed and developed such that the copper in areas 3, 13 is exposed, while copper in other areas remain shielded by the photoresist. The exposed copper in areas 3, 13 is then etched to define resistors. The photoresist is then stripped away.
5. Selective gold plating is then done for input and output contact connections, and resource well contact connections, and top surface connections. To do so, photoresist is again applied to both sides of all substrate layers, exposed using photographic mask, and developed. The substrates are then plated with nickel and gold. After the plating, the remaining photoresist is stripped.
6. Slots are then milled through all of the substrates. After milling, the plates are cleaned by rinsing in alcohol, and then in hot (70° F.) distilled water and vacuum baked for 1 hour at 149° C.
7. The final assembly step includes bonding of the dielectric layers using the fusion process described in the '374 and '677 patents. This bonding may be done at a pressure of 250 PSI and a temperature of 375° C. Slots may then be milled in the module assembly, opening the formed cavities (i.e., cavity 17). That is, the cavity opening 475 in the top layer 400 may be formed after fusion bonding. The individual modules can be de-paneled by machining.

Figure 13:
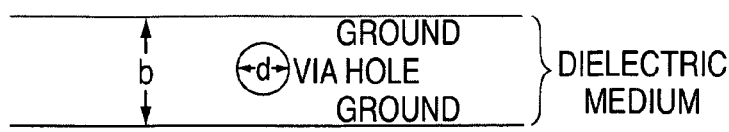
FIG. 13 shows a slab line transmission line.

Via holes used in forming interconnections between substrate layers and between sides of a substrate may present a degradation in performance if they are not compensated for by means of electromagnetic modeling and analysis. Generally speaking, thes via holes may be modeled as vertical slabline transmission lines (FIG. 13). To provide controlled impedance interconnections in the Z-plane, the teachings of "Microwave Transmission Line Impedance Data", M. A. R. Gunston., pp 63–82; Van Nostrand Reinhold Company, 1971 may be followed. The example coupler assembly disclosed herein includes, among other things, wide bandwidth directional couplers and wide bandwidth quadrature couplers. Wide bandwidth directional couplers are usually synthesized from the formulas given by, e.g., "General Synthesis Of Asymetric Multi-Element Coupled-Transmission-Line Directional Couplers", R. Levy, IEEE Trans. MTT-S, Vol. MTT-11, No.4, pp226–237; July 1963; and "Tables For Asymetric Multi-Element Coupled-Transmission-Line Directional Couplers", R. Levy, IEEE Trans. MTT-S, Vol. MTT-12, No.3, pp.275–279; May 1964. Wide bandwidth quadrature couplers, on the other hand, can be synthesized from the tables given in, e.g., "Theory And Tables Of Optimum Symetrical TEM-Mode Coupled-Transmission-Line Directional Couplers", E. G. Cristal and L. Young, IEEE Trans. MTT-S, Vol. MTT-13, No. 5, pp544–558; September 1965. Another choice is to follow the teaching set forth in "Four Port Networks Synthesized From Interconnection Of Coupled And Uncoupled Sections Of Line Lengths", Joseph D. Cappucci., U.S. Pat. No. 3,761,843; Sep. 25, 1973. The 3,761,843 patent discloses how to synthesize wide bandwidth couplers from a series of coupled and uncoupled striplines. In this case, a series of uncoupled interconnections are combined with a series of coupled sections to form a broad bandwidth quadrature coupler. Additionally, the non-uniform, coupled structures defined in "The Design And Construction Of Broadband, High Directivity, 90-Degree Couplers Using Nonuniform Line Techniques", C. P. Tresselt., IEEE Trans. MTT-S, Vol. MTT-14, No. 12, pp.647–656; December 1966; and "The Design And Computed Performance Of Three Classes Of Equal-Ripple Nonuniform Line Couplers", C. P. Tresselt, IEEE Trans. MTT-S, Vol. MTT-17, No. 4, pp. 218–230; April 1969, may be stacked and connected in tandem, vertically, to provide very wide band performance, characterized by a high pass frequency response.

A number of embodiments of the present invention have been described. Nevertheless, it will be understood that various modifications may be made without departing from the spirit and scope of the invention. Another embodiment is shown in FIGS. 14–19. These figures include a circuit block diagram (FIG. 14), top, side, and bottom views of a completed module (FIG. 15), top and bottom metallizations for three substrate layers (FIGS. 16–18), and a flange layer 19 of an alternative embodiment. The alternative embodiment of FIG. 14 includes a second resource well 40 located at the input side of the circuit 1400.

Figure 14:
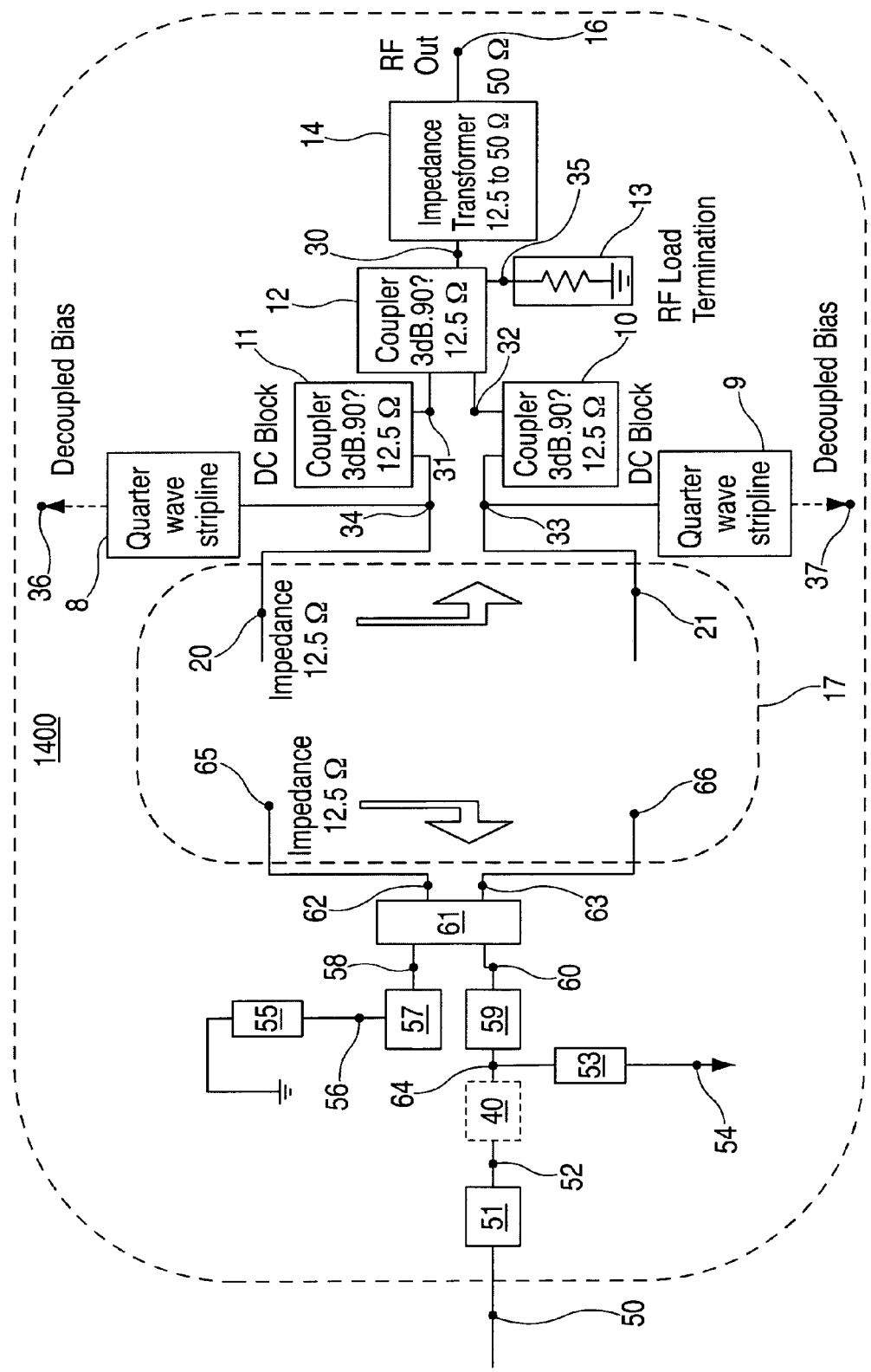
FIG. 14 shows an alternative embodiment of a coupler resource module.
Figure 15:
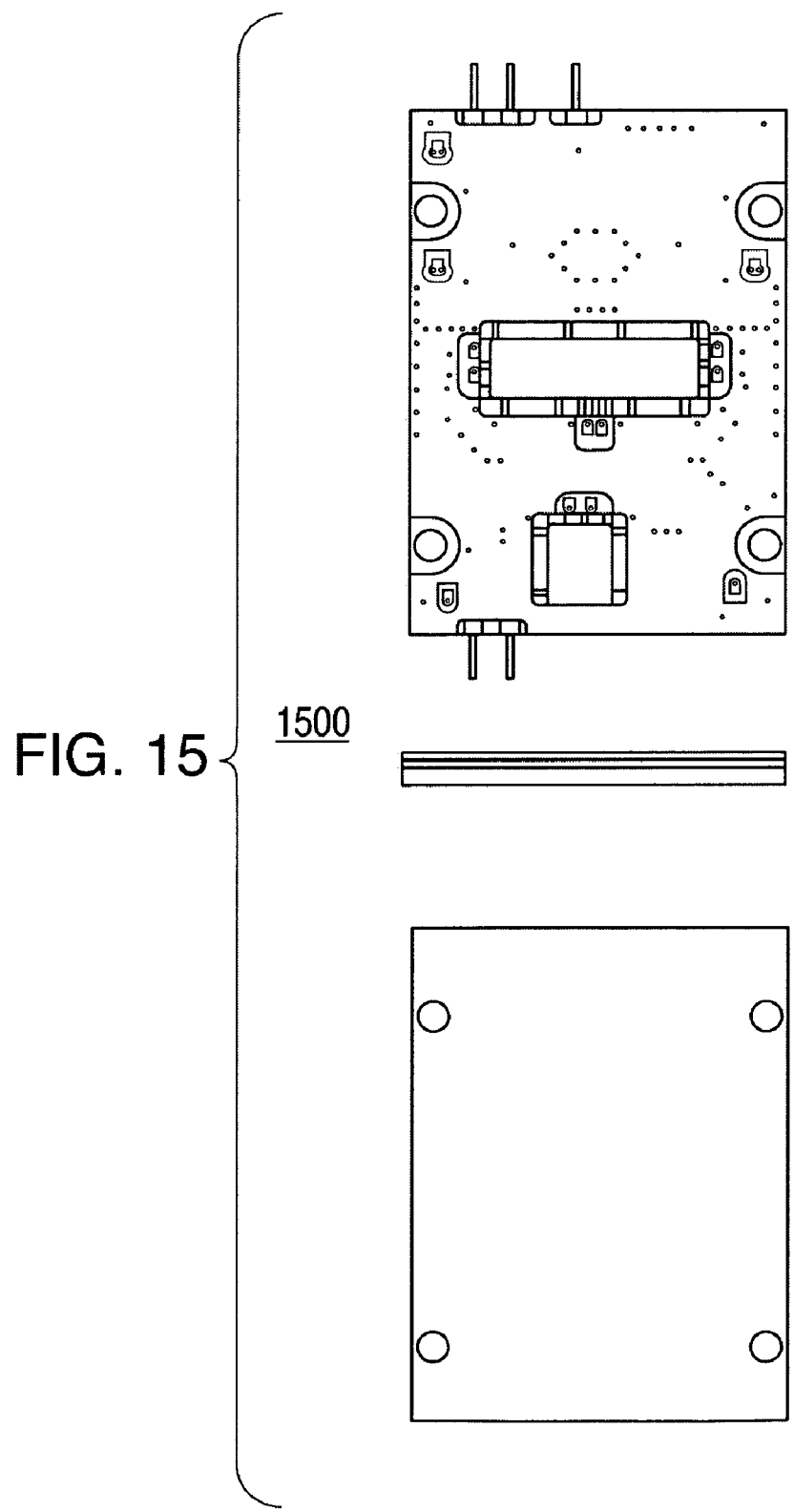
FIG. 15 shows top, side, and bottom views of the coupler resource module of FIG. 14.
Figure 16:
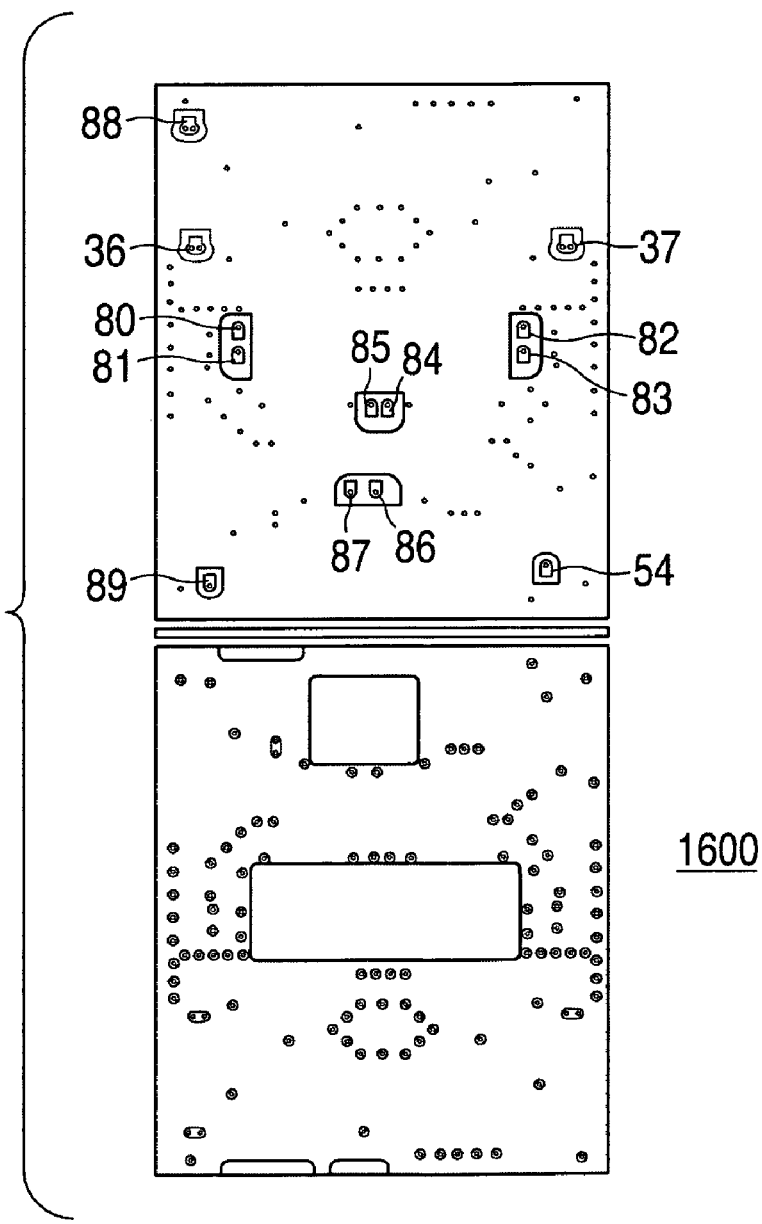
Figure 17:
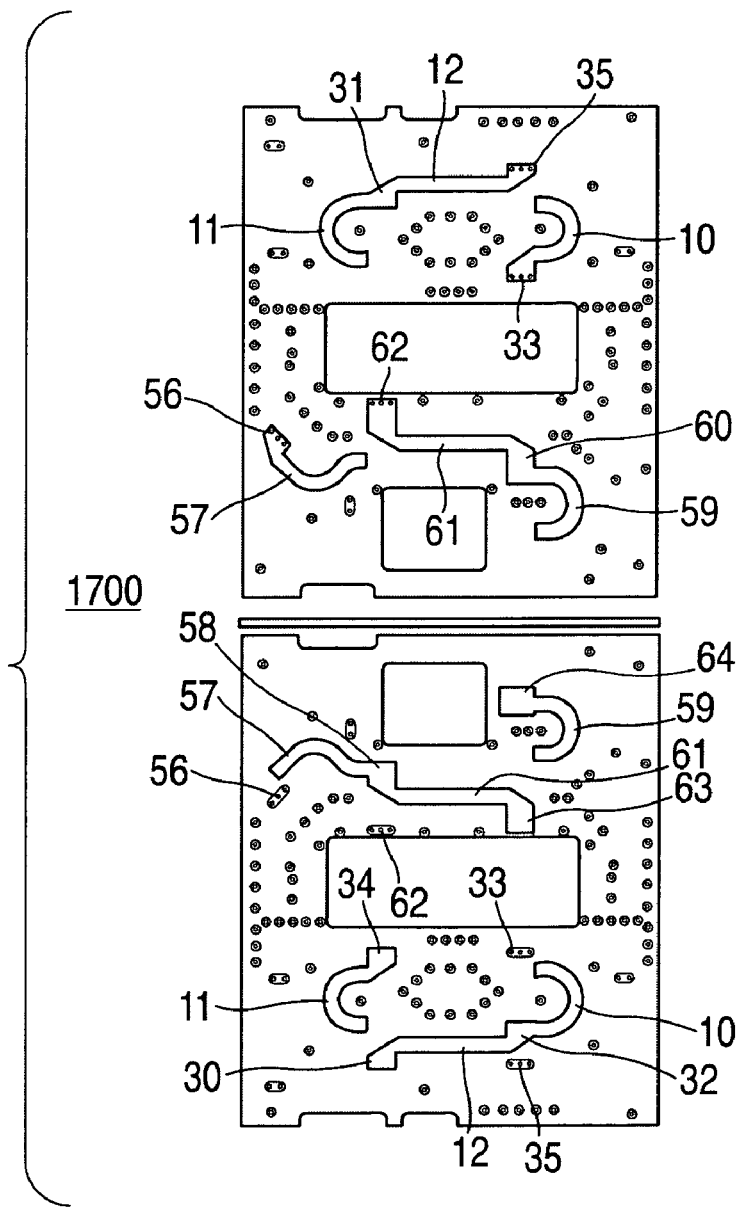
Figure 19:
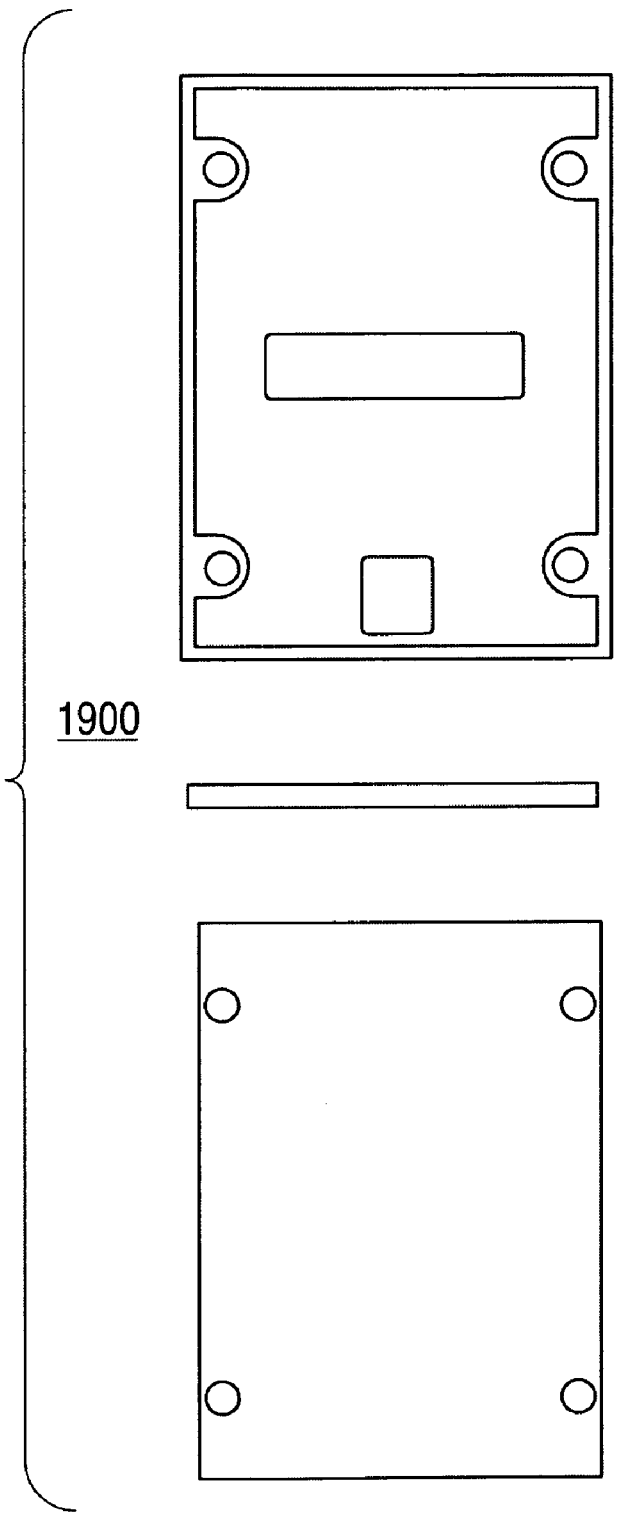
FIG. 19 shows top and bottom views of a metal flange layer.

The circuitry shown in FIG. 14 includes circuit elements and connections 9–14, 16, 17, 20–21, 30–37 substantially identical to those of FIG. 2. The embodiment 1400 also includes a modified input stage 50–66 and a second resource well 40. The input stage receives a RF signal at input 50. The signal is transformed from 50 ohms to 12.5 ohms by transformer 51 and the output signal is provided to a contact 52 at resource well 40. Additional devices (e.g., a diode, resistor, transistor, or simple bridging connection) may be coupled between terminals 52 and 64 of the resource well 40. The signal 52, as transformed by any device in resource well 40, is provided to the terminal 64 and, from there, to DC block coupler 59 and then to signal coupler 61. The outputs 62–63 of the signal coupler 61 are provided to contacts 65–66 in the resource well 17. DC bias may be provided through top surface contact points 36–37, 54, 80–87. Similarly, a DC bias may be provided at input 54 connected to quarter wave stripline 53, and input 36 connected to quarter wave stripline 8 and input 37 connected to quarter wave stripline 9. Substrate layers 1600, 1700, 1800 and flange plate 1900 may be manufactured and bonded in accordance with the process described for the implementation of FIG. 2. Other features of the substrate layers 1600, 1700, 1800, and flange plate 1900 follow from descriptions given with respect to layers 400, 500, 600, and flange plate 700.

Accordingly, other embodiments are within the scope of the following claims.

What is claimed is:
1. A coupling assembly comprising:
a plurality of composite substrate layers and a flange layer fusion bonded together in a stacked arrangement wherein said substrate layers are positioned on top of a flange layer and said substrate layers comprising embedded signal processing circuitry;
a signal input and a signal output each coupled to the embedded signal processing circuitry; and a cavity formed through an area of the plurality of substrate layers, said cavity exposing signal connection terminals coupled to the signal processing circuitry to enable the addition of a circuit element to the assembly after the fusion bonding of the flange and substrate layers and to enable coupling of the added circuit element to the signal processing circuitry; and wherein signal paths formed on at least two of said plurality of substrate layers are connected by plated via holes.

2. The assembly of claim 1 wherein the embedded signal processing circuitry comprises:

first signal processing circuitry coupled to the signal input and to a first signal connection terminal exposed within the cavity; and second signal processing circuitry coupled to the signal output and to a second signal connection terminal exposed within the cavity.

3. The assembly of claim 2 wherein said first embedded signal processing circuitry and said second embedded signal processing circuitry comprise microwave coupler circuitry.

4. The assembly of claim 3 wherein the first and second embedded signal processing circuitry further comprise impedance matching circuitry.

5. The assembly of claim 4 wherein said first embedded signal processing circuitry and said second embedded signal processing circuitry comprise circuitry selected from the group consisting of DC blocking circuitry, bias decoupling circuitry, and a RF load termination.

6. The assembly of claim 3 wherein the assembly is configured for addition of an added circuit element selected from the group consisting of a microwave circuit, a transistor, a varactor diode, a PIN diode, and a Shottky diode.

7. The assembly of claim 2 further comprising a plurality of conductive terminals exposed within the cavity and coupled to conductive terminals on an exterior surface of the assembly to provide for signal connections between a circuit element added to the cavity and external signal sources.

8. The assembly of claim 2 wherein:

the cavity exposes a top surface of the flange layer enabling coupling of the added circuit element to the flange layer.

9. The assembly of claim 1 wherein said flange layer comprises a substantially homogeneous metal core and said composite substrate layers comprise fluoropolymer composite material.

10. The assembly of claim 9 wherein coupling of the added circuit element to the flange layer comprises thermal coupling between said circuit element and the flange layer.

11. The assembly of claim 10 wherein said flange layer consist of said metal core and plated metals added to surfaces of said metal core.

12. The assembly of claim 11 wherein said plated metals added to the surface comprises a metal inhibiting oxidation of said metal core.

13. A coupling assembly comprising:

a plurality of composite substrate layers and a flange layer fusion bonded together in a stacked arrangement wherein said substrate layers are positioned on top of a flange layer and said substrate layers comprising embedded signal processing circuitry;

a signal input and a signal output each coupled to the embedded signal processing circuitry; and a cavity formed through an area of the plurality of substrate layers, said cavity exposing signal connection terminals coupled to the signal processing circuitry to enable the addition of a circuit element to the assembly after the fusion bonding of the flange and substrate layers and to enable coupling of the added circuit element to the signal processing circuitry;

wherein the embedded signal processing circuitry comprises:

first signal processing circuitry coupled to the signal input and to a first signal connection terminal exposed within the cavity;

second signal processing circuitry coupled to the signal output and to a second signal connection terminal exposed within the cavity; and wherein the cavity exposes a top surface of the flange layer enabling coupling of the added circuit element to the flange layer.

14. A coupling assembly comprising:

a flange layer comprising a substantially homogeneous metal core and plated metals added to surfaces of said metal core and inhibiting oxidation of said metal core;

a plurality of fusion bonded composite substrate layers comprising a fluoropolymer material, said layers positioned in a stacked arrangement on top of the flange layer and comprising first and second embedded signal processing circuitry;

a signal input coupled to the first embedded signal processing circuitry;

a signal output coupled to the second embedded signal processing circuitry;

a cavity formed through an area of the plurality of substrate layers and exposing a top surface of the flange layer, said cavity exposing first signal connection terminals coupled to the first signal processing circuitry and second signal connection terminals coupled to the second signal processing circuitry, said cavity enabling the addition of a circuit element to the assembly after the fusion bonding of the substrate layers and enabling coupling of the added circuit element to the signal, processing circuitry and to the flange layer.

15. The assembly of claim 14 wherein said first embedded signal processing circuitry and said second embedded signal processing circuitry comprise microwave coupler circuitry.

16. The assembly of claim 15 wherein the first and second embedded signal processing circuitry further comprise impedance matching circuitry.

17. The assembly of claim 14 wherein said first embedded signal processing circuitry and said second embedded signal processing circuitry comprise circuitry selected from the group consisting of DC blocking circuitry, bias decoupling circuitry, and a RF load termination.

18. The assembly of claim 14 further comprising a plurality of conductive terminals exposed within the cavity and coupled to conductive terminal,s on an exterior surface of the assembly to provide for signal connections between a circuit element added to the cavity and external signal sources.

19. The assembly of claim 18, wherein said first signal processing circuitry is formed by metallization disposed on surfaces of at least two of said plurality of substrate layers and said at least two of said plurality of substrate layers are connected by plated via holes.

20. A coupling assembly comprising:

a plurality of composite substrate layers and a flange layer fusion bonded together in a stacked arrangement wherein said substrate layers are positioned on top of a flange layer and said substrate layers comprising embedded signal processing circuitry;

a signal input and a signal output each coupled to the embedded signal processing circuitry; and a cavity formed through an area of the plurality of substrate layers, said cavity exposing signal connection terminals coupled to the signal processing circuitry to enable the addition of a circuit element to the assembly after the fusion bonding of the flange and substrate layers and to enable coupling of the added circuit element to the signal processing circuitry;

wherein said flange layer comprises a substantially homogeneous metal core and said composite substrate layers comprise fluoropolymer composite material.

* * * * *